United States Patent
Tsai et al.

(10) Patent No.: US 10,264,696 B2
(45) Date of Patent: Apr. 16, 2019

(54) TOP LOADING CARTRIDGE

(71) Applicant: HEWLETT PACKARD ENTERPRISE DEVELOPMENT LP, Houston, TX (US)

(72) Inventors: Pinche Tsai, Richardson, TX (US); Stephen Spencer, Houston, TX (US); Kevin D. Conn, Montgomery, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 256 days.

(21) Appl. No.: 15/029,423

(22) PCT Filed: Nov. 1, 2013

(86) PCT No.: PCT/US2013/067915
§ 371 (c)(1),
(2) Date: Apr. 14, 2016

(87) PCT Pub. No.: WO2015/065464
PCT Pub. Date: May 7, 2015

(65) Prior Publication Data
US 2016/0278231 A1 Sep. 22, 2016

(51) Int. Cl.
*H05K 7/14* (2006.01)
*G11B 33/12* (2006.01)

(52) U.S. Cl.
CPC ......... *H05K 7/1487* (2013.01); *G11B 33/128* (2013.01); *H05K 7/1489* (2013.01)

(58) Field of Classification Search
CPC ....... G11B 17/00; G11B 17/22; G11B 33/128; H05K 7/1487; H05K 7/1489
See application file for complete search history.

(56) References Cited

U.S. PATENT DOCUMENTS

| | | | |
|---|---|---|---|
| 4,805,045 A * | 2/1989 | Schonfeld | G11B 15/67 242/332.4 |
| 5,136,146 A | 8/1992 | Anglin et al. | |
| 5,153,862 A * | 10/1992 | Taylor | G11B 17/221 360/92.1 |
| 5,943,305 A * | 8/1999 | Fitzgerald | G11B 17/225 360/98.06 |
| 6,236,573 B1 | 5/2001 | Gundlach et al. | |

(Continued)

FOREIGN PATENT DOCUMENTS

| | | |
|---|---|---|
| CN | 101720211 B | 6/2010 |
| EP | 1083518 | 3/2001 |

(Continued)

OTHER PUBLICATIONS

ISA/KR, International Search Report dated Aug. 5, 2014, PCT/US2013/067915, 12 pp.

*Primary Examiner* — Carl J Arbes
(74) *Attorney, Agent, or Firm* — Hewlett Packard Enterprise Patent Department (57) ABSTRACT

A top loading cartridge is provided herein. The top loading cartridge includes a support member and a lock mechanism. The support member to receive an electronic component. The lock mechanism includes a handle and an engagement member. The handle to connect to the support member and move between a first position and a second position. The engagement member to extend from the support member to engage with a chassis.

20 Claims, 10 Drawing Sheets

(56) References Cited

U.S. PATENT DOCUMENTS

| | | |
|---|---|---|
| 6,654,252 B2 | 11/2003 | Raynham |
| 7,116,241 B2 | 10/2006 | Post et al. |
| 7,536,701 B2 | 5/2009 | McCormack et al. |
| 2002/0093785 A1 | 7/2002 | Chi |
| 2003/0002261 A1 | 1/2003 | Berry |
| 2004/0196727 A1 | 10/2004 | Garnett et al. |
| 2008/0303390 A1 | 12/2008 | Hsiung |
| 2010/0265645 A1 | 10/2010 | Wang |

FOREIGN PATENT DOCUMENTS

| | | |
|---|---|---|
| EP | 1286265 | 2/2003 |
| TW | M425496 | 3/2012 |
| TW | M456068 | 6/2013 |

\* cited by examiner

TOP LOADING CARTRIDGE

BACKGROUND

A data center rack contains electronic components. A chassis fits into the data center rack. The chassis includes a tray to receive electronic components for processing, storage, memory, networking, and cooling. The electronic components may be arranged in a variety of ways depending on the type of electronic component, purpose of the electronic component, and computing needs.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures.

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Data center racks are designed to provide a variety of computing solutions. The design of the data center rack must balance conflicts between power density, spatial layout, temperature requirements, acoustic noise, and other factors. The type of electronic components installed in the data center rack depends on the computing solution and the power and cooling requirements. The electronic components are mounted or loaded on a tray in a chassis. The chassis is housed in the data center rack. For example, the electronic components may be electronic components that are loaded into the front or the side of the chassis. Each chassis may contain a plurality of modules, each containing one or a combination of hard drives, processors, heat sinks, fans, network switches in a single tray. Some of the modules may include hot-pluggable electronic components, which may be removed and/or replaced without shutting down the entire chassis. The hot-pluggable electronic components may be arranged on the chassis in an order that enables access to a desired hot-pluggable electronic component without disrupting the operation of other electronic components on the chassis.

In examples, a top loading cartridge is provided. The top loading cartridge includes a support member and a lock mechanism. The support member to receive an electronic component. The lock mechanism includes a handle and an engagement member. The handle to connect to the support member and move between a first position and a second position. The engagement member to extend from the support member to engage with a chassis.

As used herein the phrase "electronic component" refers to an electronic device, such as a hard drive, a processor, a heat sink, a fan, and/or a memory device.

Figure 1:
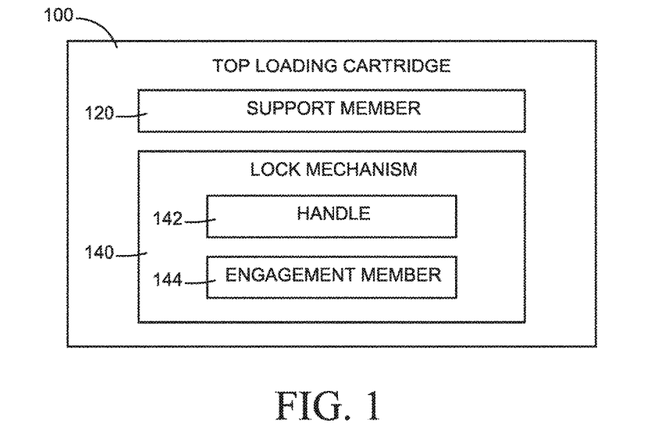
FIG. 1 illustrates a block diagram of a top loading cartridge according to an example.

FIG. 1 illustrates a block diagram of a top loading cartridge 100 according to an example. The top loading cartridge 100 includes a support member 120 and a lock mechanism 140. The support member 120 to receive an electronic component.

The lock mechanism 140 includes a handle 142 and an engagement member 144. The handle 142 to connect to the support member 120. The handle 142 to move between a first position and a second position. The engagement member 144 to extend from the support member 120 to engage with a chassis via, for example, a tray. The engagement member 144 to move between an engaged position and an unengaged position. The engagement member 144 to move based on a force applied thereto. For example, the force may be applied directly to a portion of the engagement member 144 extending from the support member 120 or indirectly by a force applied by the handle 142 based on a position of the handle 142.

Figure 2A:
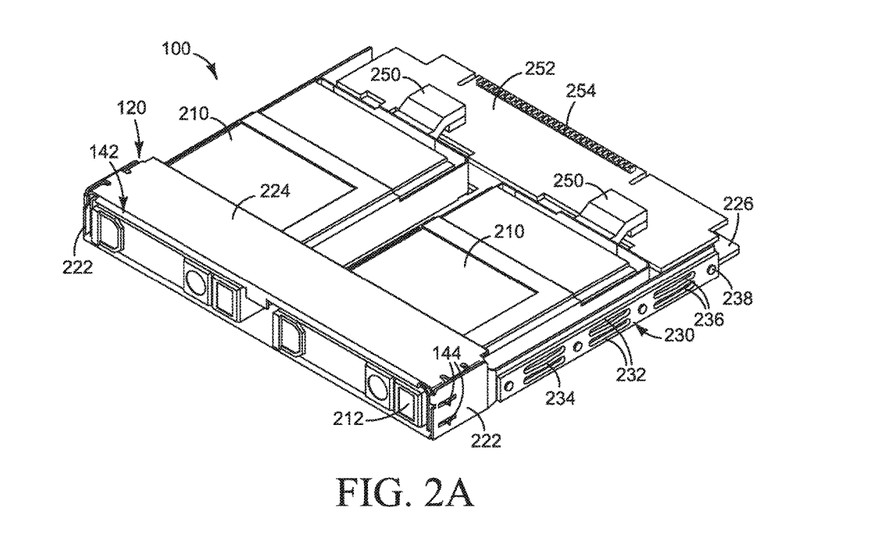
FIGS. 2A-2C illustrate isometric views of the top loading cartridge of FIG. 1 according to examples.
Figure 2B:
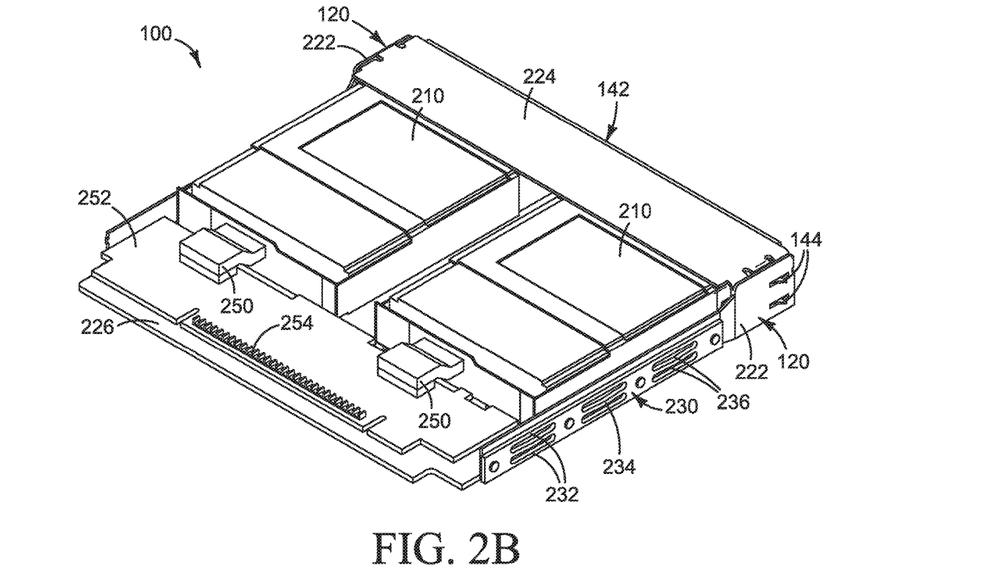
Figure 2C:
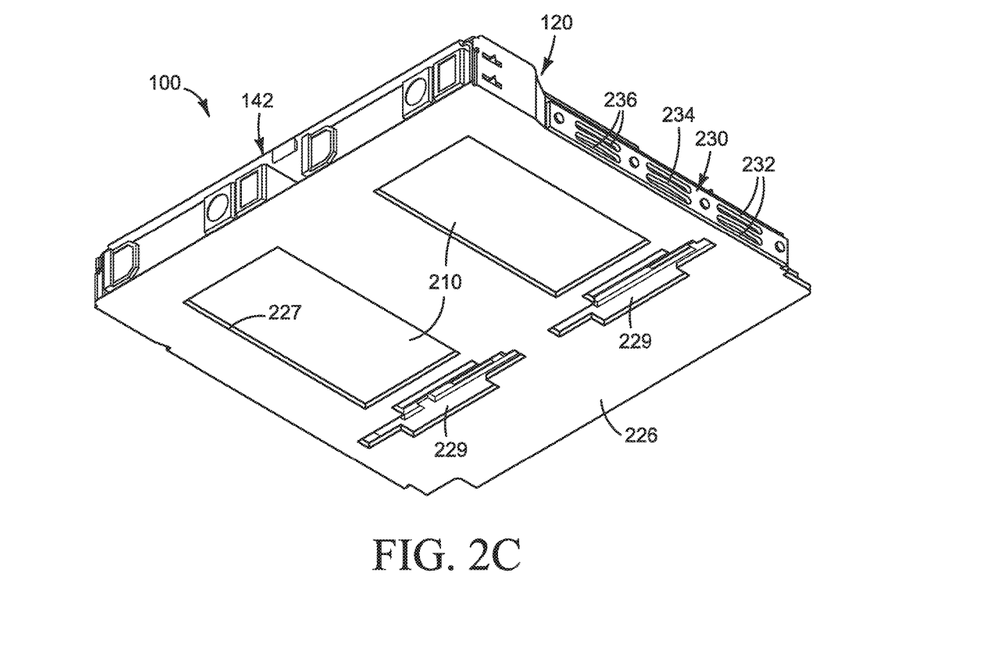

FIGS. 2A-2C illustrate isometric views of the top loading cartridge 100 of FIG. 1 according to examples. The top loading cartridge 100 of FIGS. 2A-2C are formed to receive two electronic components 210. The electronic components are illustrated as hot-pluggable hard drives, such as a small form factor hard disk drive (SFF HDD). For example, the SFF HDD may be inserted into the top loading cartridge 100 before or after the top loading cartridge 100 is inserted into a chassis. The SFF HDD includes an eject button 212 to release the SFF HDD from the top loading cartridge 100 before or after the top loading cartridge 100 is inserted into the chassis. Other electronic components 210 may include an optical disk drive, a compact disk drive, a digital versatile disk drive, and/or a printed circuit assembly with a dual in-line memory module socket. Other hot-pluggable devices such as a processor, a heat sink, a fan, and/or a memory device may be compatible with the top loading cartridge 100.

Referring to FIGS. 2A-29, front and back isometric views of the top loading cartridge 100 are provided. The support member 120 includes two side walls 222, a top wall 224, and a support wall 226. The two side walls 222 are spaced apart from one another. The top wall 224 traverses the two side walls 222. The support wall 226 extends between the two side walls 222 and provides support for the electronic component 210. The top wall 224, the two side walls 222, and the support wall 226 also forms a top aperture to enable insertion and removal of the electronic component 210 such that the electronic component 210 may be inserted and removed without removing the top loading cartridge 100.

The top loading cartridge 100 may also include a rail member 230 attached to the support member 120. For example, the rail member 230 may be attached to each of the two side walls 222. The rail member 230 to engage with a tray or chassis that receives the top loading cartridge 100. The rail member 230 includes a first rail portion 232 and a second rail portion 234 spaced apart from one another. For example, the first rail portion 232 to mate with the side wall 222 of the support member 120 and the second rail portion 234 to engage with the tray or chassis. Alternatively, the first rail portion 232 to engage with the tray or chassis and the second rail portion 234 to mate with the side wall 222, or both the first and second rail portions 232, 234 to engage with the tray or chassis.

The rail member 230 may be formed of a plastic with apertures or voids therein to form the area that makes the first rail portion 232 and the second rail portion 234 spaced apart 236 from one another. For example, the first rail portion 232 may be formed of a planar member, and the second rail portion 234 may be formed with an arc or convex surface extending from the side wall 222 or the first rail portion 232. Alternatively, the first rail portion 232 may be formed of an arc or convex surface extending from the side wall 222 and the second rail portion 234 may be formed of an arc or convex surface or a planar member. The arc or convex surface may include variations and may be formed compress when the top loading cartridge is inserted in to the tray or chassis. The rail member 230 may be attached to the support member 120 via a fastener 238, such as a screw.

The top loading cartridge 100 may further include a connector 250. For example, the connector 250 to form a connection between the electronic component 210 and a cartridge printed circuit assembly 252 via, for example, a hard disk drive (HDD) backplane or other connection. The cartridge printed circuit assembly 252 may further include a set of high speed connectors such as a peripheral component interconnect express (PCIe) connector pins that connect to a baseboard.

FIG. 2C, illustrates a front isometric view of the top loading cartridge 100. The support wall 226 is illustrated to include a receiving member 227 formed therein. The receiving member 227 to receive and support the electronic component 210. For example, the receiving member 227 is formed in the support wall 226 to manage cooling and vibration of the electronic component 210. The support wall 226 may further include a base pan aperture 229 to provide clearance for the assembly and disassembly of the connections between the electronic component 210 and the top loading cartridge 100.

Figures 3, 4:
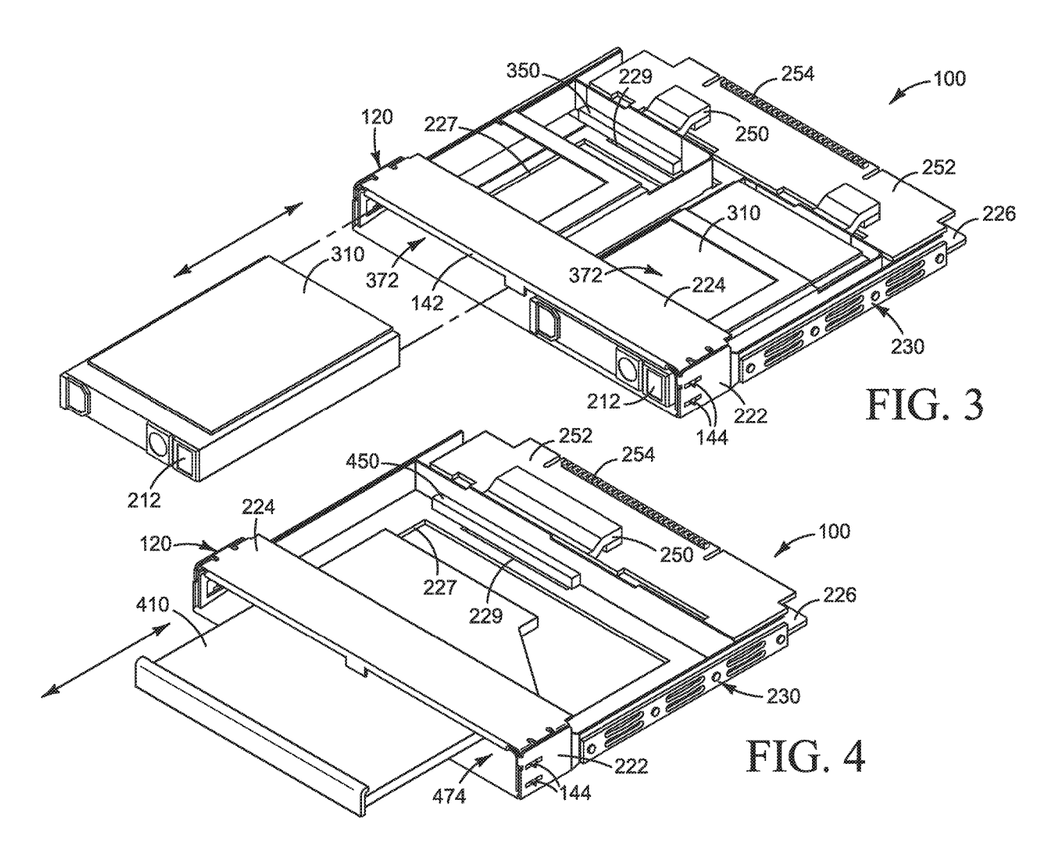
FIGS. 3-4 illustrate perspective views of the top loading cartridge of FIG. 1 according to examples.

FIGS. 3-4 illustrate perspective views of the top loading cartridge of FIG. 1 according to examples. Referring to FIG. 3, the top loading cartridge 100 is illustrated to receive two electronic components 210, such as two SFF HDDs 310. FIG. 3 illustrates one of the SFF HDDs 310 fully inserted into the top loading cartridge 100 and a second SFF HDD 310 aligned to be inserted, but not yet inserted. The SFF HDDs 310 are inserted through a pair of top aperture 372 formed in the top loading cartridge 100 between one of the two side walls 222, the top wall 224, and the support wall 226. The SFF HDDs 310 are each supported by a receiving member 227 and connected to a hard disk drive backplane 350. The SFF HDDs 310 are connected to the printed circuit assembly 252, via, a connector 250. For example, FIG. 3 illustrates the connector 250 as an angular connector that connects to the printed circuit assembly 252 on one end and a hard disk drive backplane 350 on an opposite end. The angular connector is used since the printed circuit assembly 252 and the hard disk drive backplane 350 are positioned approximately perpendicular to one another. The base pan apertures 229 assist with ease of servicing and/or assembling the hard disk drive backplane 350. The base pan apertures 229 may also be beneficial for managing cooling along the hard disk drive backplane 350.

Referring to FIG. 4, a similar top loading cartridge 100 is illustrated. The electronic component 210 is illustrated as an optical disk drive 410 that is partially inserted into the top loading cartridge 100. The optical disk drive 410 is inserted through a single top aperture 474 formed in the top loading cartridge 100 between the two side walls 222, the top wall 224, and the support wall 226. The optical disk drive is supported by the receiving member 227 and connections to the cartridge printed circuit assembly 252 are made along an optical disk drive backplane 450.

Both electronic components 210 of FIGS. 3-4 may be used with a server, such as a server with top loading cartridges. The electronic components may be inserted by aligning the electronic component 210 with the appropriate top aperture 372, 474 and pushing or apply pressure to the electronic component 210 to insert it into the top loading cartridge 100. After the electronic component 210 is fully inserted, the electronic component 210 engages with the connector 250 on the top loading cartridge 100 to position the electronic component 210 in a functional position. In the functional position, the electronic component 210 is positioned for usage by for example the server that the electronic component 210 is attached to.

The electronic components 210 may be removed by pressing a release button, such as an eject button 212 and pulling the electronic component 210 out of the top loading cartridge 100. The electronic components 210 may be inserted and/or removed prior to inserting the top loading cartridge 100 into the chassis or while the top loading cartridge 100 is in the chassis. The handle 142 is formed such that it does not interfere with the insertion and/or removal of the electronic components 210 through the top aperture(s) 372, 474. The top aperture(s) 372, 474 enable the electronic components 210 to be inserted and removed while the server operates.

Figures 5A, 5B:
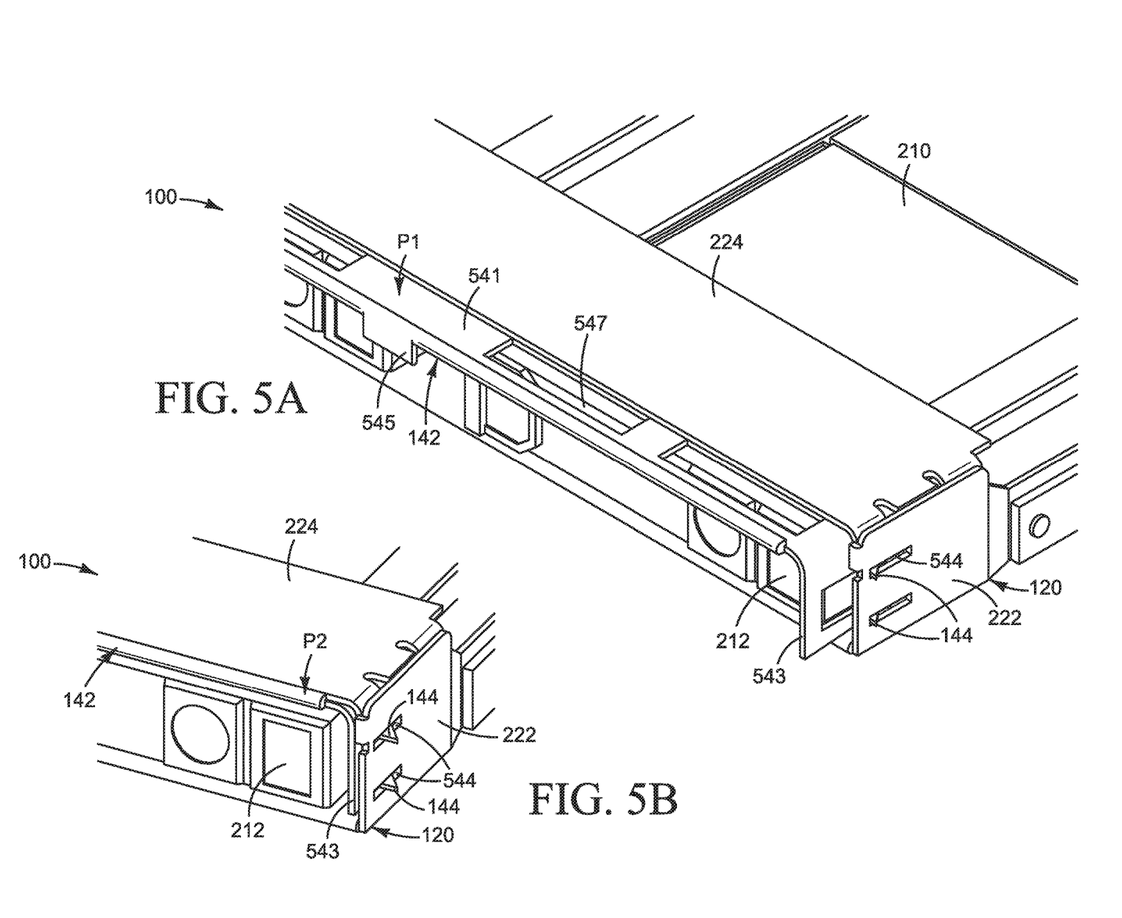
FIGS. 5A-5B illustrate isometric side views of a portion of the top loading cartridge of FIG. 1 according to examples.

FIGS. 5A-5B illustrate isometric side views of a portion of the top loading cartridge 100 of FIG. 1 according to examples. The top loading cartridge 100 further illustrates the handle 142 including a planar member 541 and a pair of side protrusions 543. The planar member 541 is adjacent to a top wall 224 of the support member 120. The pair of side protrusions 543 extend from the planar member 541, such that the side protrusions 543 are perpendicular to the planar member 541. The handle 142 further includes a tab 545 extending from the planar member 541 and at least one handle aperture 547, illustrated as two on each side of the tab 545, formed in the planar member 541.

The handle 142 to connect to the support member 120 and moves between a first position, P1, and a second position, P2. Referring to FIG. 5A, the handle 142 is in a first position, P1, or extended. FIG. 5B illustrates the handle 142 in a second position, P2, or retracted. The tab 545 and/or the at least one handle aperture 547 may be used to move the handle 142 between the first position, P1, and the second position, P2. The handle 142 may control the lock mechanism 144. For example, the movement of the handle 142 between the first position, P1, and the second position, P2, applies a force to the engagement member 144 to control the lock mechanism 140. Moreover, the engagement member 144 may extend past the support member 120 through an engagement aperture 544, as illustrated in FIG. 5B. The engagement member 144 may also receive a force from a tray or a chassis, such as a direct force, that enables insertion of the top loading cartridge 100 by reducing the distance the engagement member 144 extends past the support member 120 until the engagement member 144 engages with a receptacle in the tray or chassis.

Figure 6A:
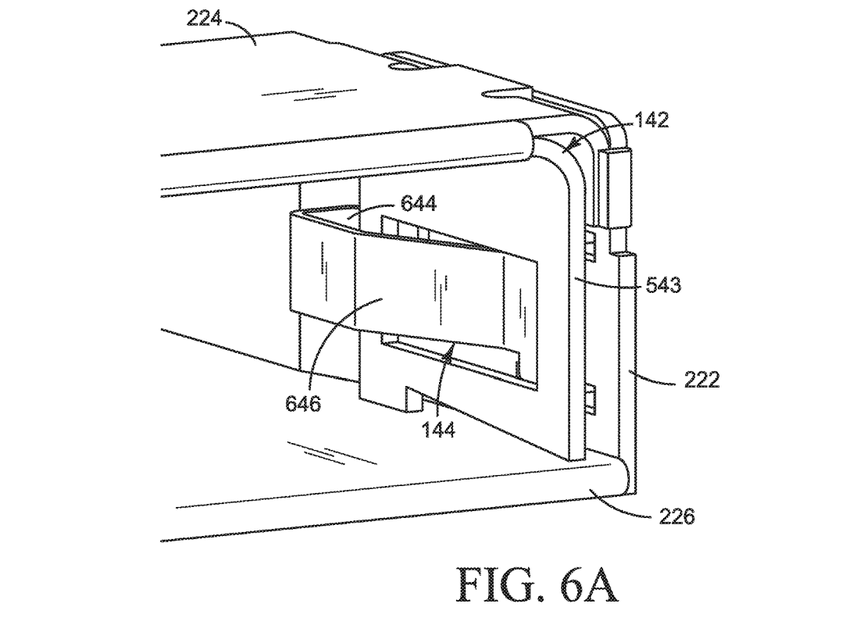
FIGS. 6A-6B illustrate enlarged views of a portion of the lock mechanism of FIG. 1 according to examples.

FIGS. 6A-6B illustrate enlarged views of a portion of the lock mechanism 144 of FIG. 1 according to examples. Referring to FIG. 6A, the engagement member 144 includes a resilient member 646 to move between an equilibrium position, E, and a displaced position, D, based on a position of the handle 142. The resilient member 646 is positioned adjacent to the handle 142 or through a portion of the handle 142.

Figure 6B:
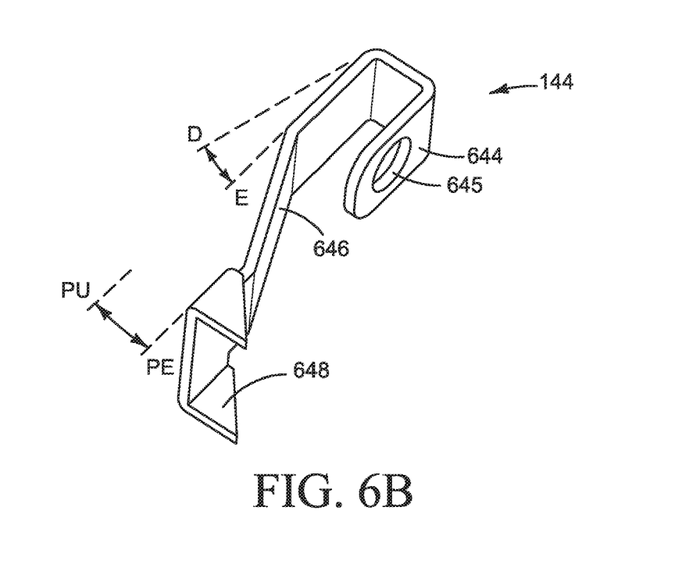

For example, referring to FIG. 6B, the engagement member 144 includes a hook member 648 on one end, a fixed member 644, such as an anchor member or a fastener, on an opposite end, and a resilient member 646 therebetween. The fixed member 644 may be secured to the support member 120 via, for example, an aperture 645. The resilient member 646 to engage with the handle 142 and move or bend between an equilibrium position, E, and a displaced position, D, based on a position of the handle 142. The resilient member 646 may be formed of a sheet metal with properties that enable it to bend and/or move to form a spring.

The hook member 648 to move between an engaged position, PE, and an unengaged position, PU, based on a position of the handle 142. In the engaged position, PE, the hook member 648 extends from the support member 120 to engage with a chassis. The hook member 648 may be formed of a rigid metal and include one or more hooks formed to engage with the chassis and secure the top loading cartridge 100 therein.

Figure 7A:
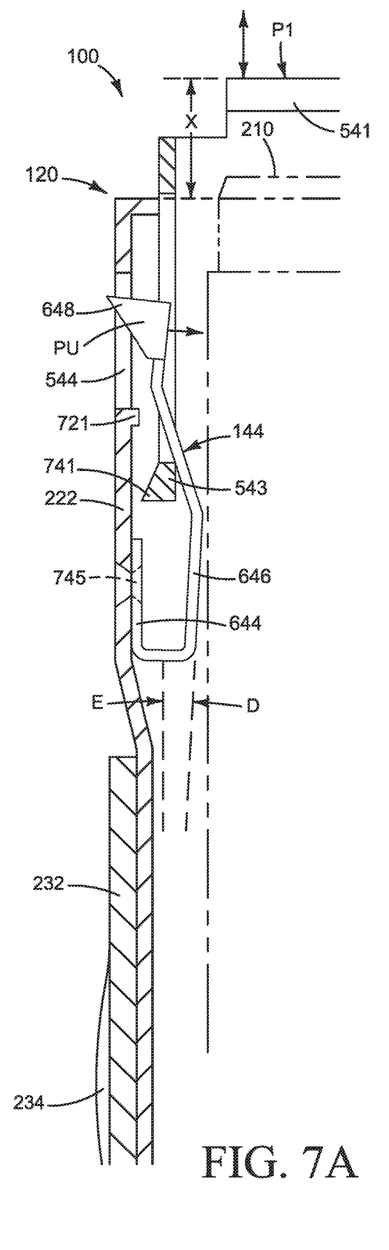
FIGS. 7A-7B illustrate schematic views of the hand of FIG. 1 according to examples.
Figure 7B:
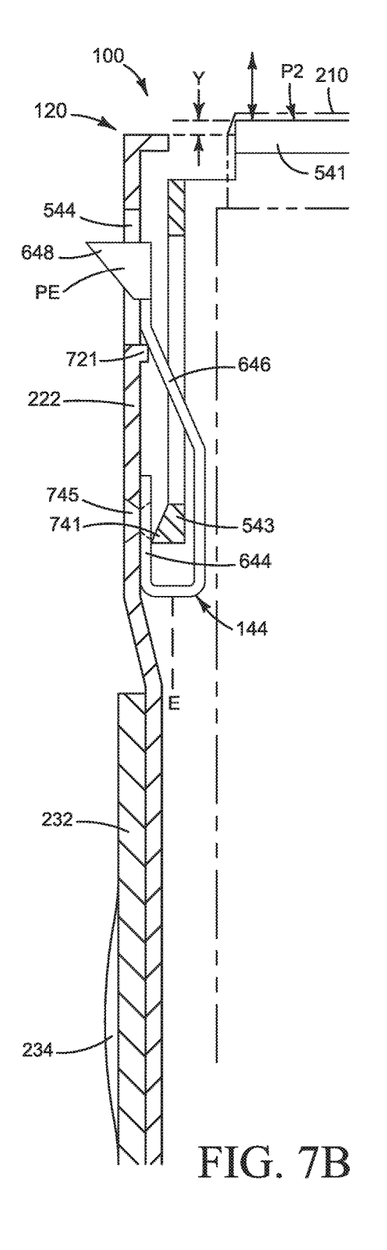

FIGS. 7A-7B illustrate schematic views of the handle 142 of FIG. 1 according to examples. Referring to FIG. 7A, the handle 142 is in a first position P1, fully extended from the support member 120. In the first position, P1, the distance between the planar member 541 of the handle 142 and the top wall 224 of the support member 120 is X, where X is the greatest gap or distance allowed between the handle 142 and the support member 120. The distance is controlled by a limiter 741 formed on an end of the pair of side protrusions 543. The limiter 741 engages with a stop 721 on the top wall 224 or the side walls 222. The stop 721 may include, for example, a protrusion or lip to prevent the handle 142 from being extended beyond the limiter 741.

The handle 142 may be in the first position, P1, when the top loading cartridge 100 is inserted into the chassis and when the top loading cartridge 100 is being removed from the chassis. The handle 142 provides a place for the user to grip or hold the top loading cartridge 100 with one hand for ease of use during insertion and removal. When the handle 142 is in the first position, P1, the engagement member 144 is in an unengaged position, PU, such that there would be no engagement with a chassis. In the unengaged position, the resilient member 646 is in displaced position, D, and the hook member 648 is retracted to either not extend past the side wall 222 of the support member 120 or not fully extend past the side wall 222. The resilient member 646 may bend or move from the equilibrium position, E, to the displaced position, D, by the handle 142. The displacement of the resilient member 646 causes the hook member 648 to retract inwards towards the center of the support member 120. The engagement member 144 is attached to the support member 120 via, for example, a rivet or fastener 745.

FIG. 7B illustrates the handle 142 in a second position P2, fully retracted or not extending from the support member 120. In the second position, P2, the distance between the planar member 541 of the handle 142 and the top wall 224 of the support member 120 is Y, where Y is the smallest distance or gap allowed between the handle 142 and the support member 120. The design of the handle 142 and/or planar member 541 and the pair of side protrusions 543 control the distance Y.

The handle 142 may be in the second position, P2, after the top loading cartridge is inserted into the chassis, during operation of the electronic component 210, and/or prior to removal of the loading cartridge from the chassis. When the handle 142 is in the second position P2, the engagement member 144 is in an engaged position, PE. In the engaged position, PE, the resilient member 646 is in an equilibrium position, E, where it is in a resting state. In the equilibrium position, the resilient member 646 allows the hook member 648 to extend from the support member 120 and to engage with a chassis, using for example, an engagement aperture 544. The handle 142 is also designed to enable the electronic component 210 to be inserted into the top loading cartridge 100, while the handle 142 is in the second position through a top aperture, as discussed with reference to FIGS. 3-4 above.

Alternatively, the handle 142 may also be in the second position, P2, while the top loading cartridge 100 is being inserted into the chassis. For example, the insertion movement may enable the tray or chassis to apply a force directly to the engagement members 144, such as the hook member 648. The force applied to the engagement members 144 during insertion may push the hook member 648 inward and move the resilient member 646 to a displaced position, D. Once the top loading cartridge 100 is fully inserted, the force applied to the engagement member is released when the hook member 648 slides into a receptacle or other opening on the tray or chassis. The release of the force applied to the engagement member 144, moves the resilient member 646 to the equilibrium position, E.

In a further alternative, the engagement between the handle 142 and the engagement member 144 may be reversed. For example, When the handle 142 is in the first position P1, the engagement member 144 is in an unengaged position, PU. In the unengaged position, PU, the resilient member 646 is in an equilibrium position, E. When the handle 142 is in the second position P2, the engagement member 144 is in an engaged position, PE. In the engaged position, PE, the resilient member 646 is in a displaced position, D.

Figure 8:
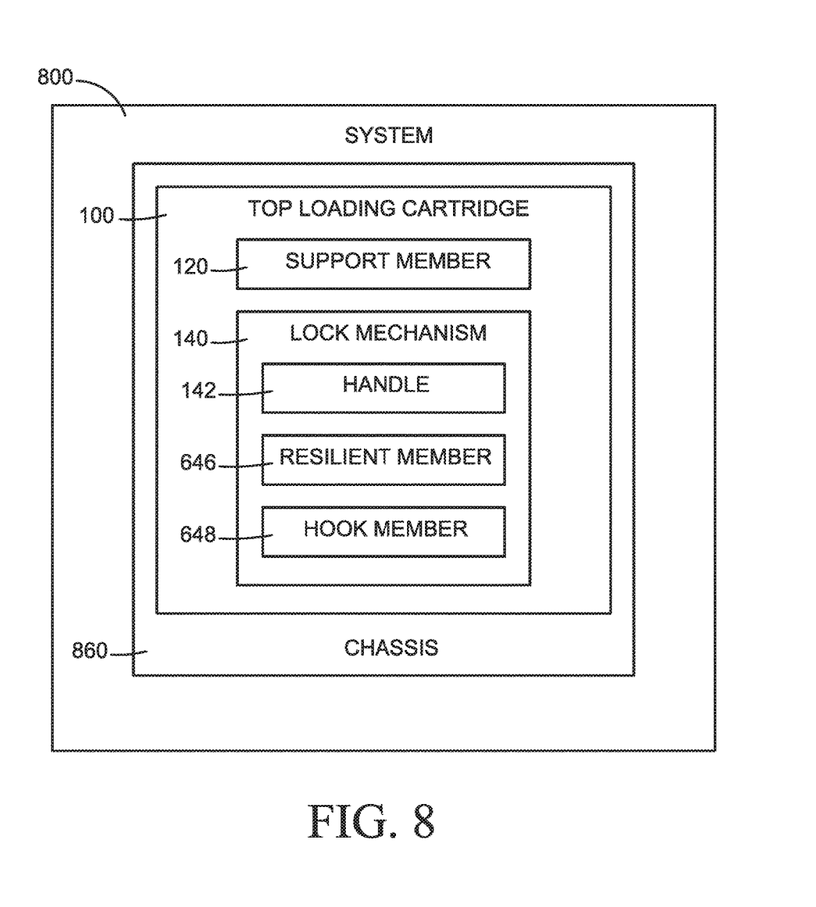
FIG. 8 illustrates a block diagram of a system according to an example.

FIG. 8 illustrates a block diagram of a system 800 according to an example. The system 800 includes a top loading cartridge 100 and a chassis 860. The top loading cartridge 100 to receive an electronic component that can be inserted and removed while the system operates. The top loading cartridge 100 includes a support member 120 and a lock mechanism 140. The support member 120 to receive an electronic component 210. The chassis 860 to receive the top loading cartridge 100.

Figure 9A:
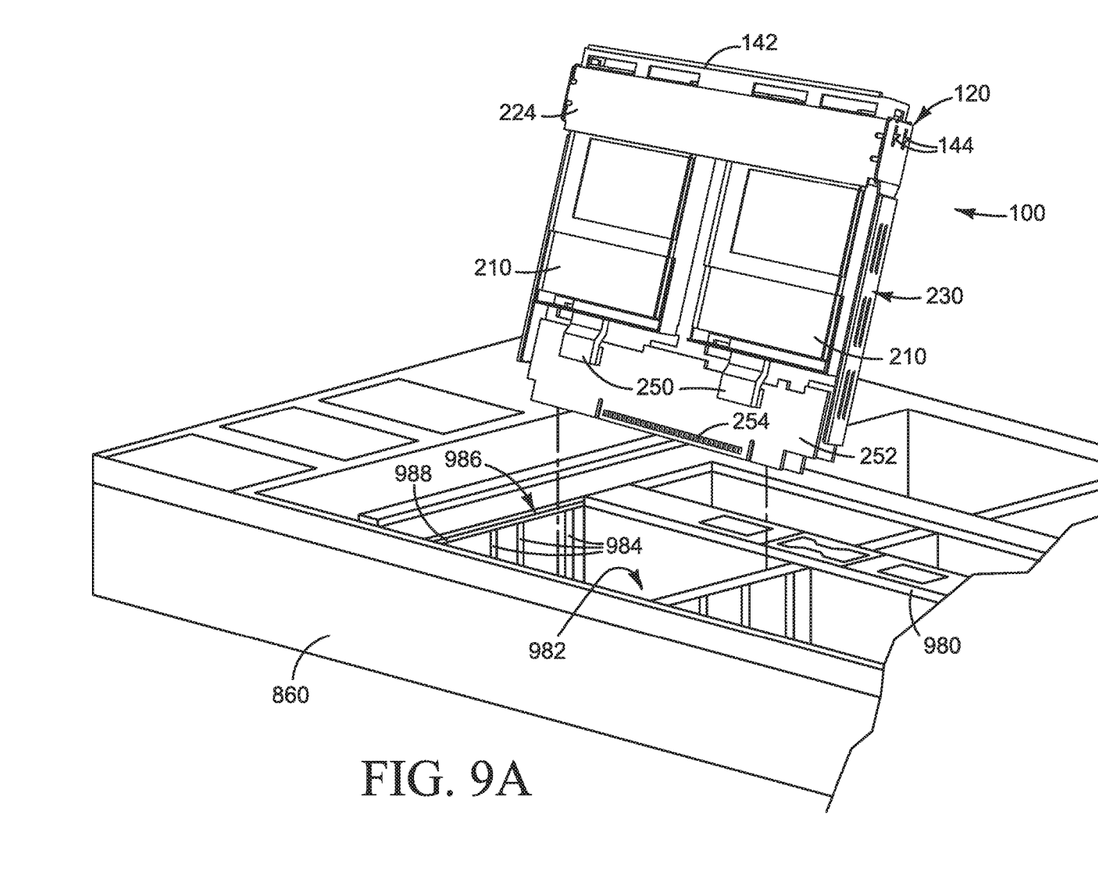
FIGS. 9A-9B illustrate the system of FIG. 8 according to examples.

FIGS. 9A-9B illustrates the system of FIG. 8 according to examples. Referring to FIG. 9A, a perspective view of the system 800 is illustrated. The top loading cartridge 100 includes a support member 120. The support member 120 includes two side walls 222, a top wall 224, and a support wall 226. The two side walls 222 are spaced apart from one another. The top wall 224 traverses the two side walls 222. The support wall 226 extends between the two side walls 222 and provides support for the electronic component 210. The top wall 224, the two side walls 222, and the support wall 226 to form the top aperture 372 to enable insertion and removal of the electronic component, such that the electronic component 210 may be inserted and removed without removing the top loading cartridge 100.

The top loading cartridge 100 may also include a rail member 230 attached to the support member 120. For example, the rail member 230 may be attached to each of the two side walls 222. The rail member 230 includes a first rail portion 232 and a second rail portion 234 spaced apart from one another. The first rail portion 232 to mate with the side wall 222 of the support member 120 and the second rail portion 234 to engage with the tray or chassis. Alternatively, the first rail portion 232 to engage with the tray or chassis and the second rail portion 234 to mate with the side wall 222, or both the first and second rail portions 232, 234 to engage with the tray or chassis.

The rail member 230 may be formed of a plastic with apertures or voids therein to form the area that makes the first rail portion 232 and the second rail portion 234 spaced apart 236 from one another. For example, the first rail portion 232 may be formed of a planar member, and the second rail portion 234 may be formed with an arc or convex surface extending from the side wall 222 or the first rail portion 232. Alternatively, the first rail portion 232 may be formed of an arc or convex surface extending from the side wall 222 and the second rail portion 234 may be formed of an arc or convex surface or a planar member. The rail member 230 may be attached to the support member 120 via a fastener 238, such as a screw.

The support wall 226 may also include the receiving member 227 and base pan apertures 229. The receiving member 227 formed in the support wall 226 to receive the electronic component 210, such that the receiving member 227 supports the electronic component 210. The receiving member 227 may also be used to manage cooling and vibration of the electronic component 210. The base pan apertures 229 to provide clearance for the assembly and disassembly of the connections between the electronic component 210 and the top loading cartridge 100.

The lock mechanism 140 is connected to the support member 120 and includes a handle 142, a resilient member 646, and a hook member 648. The handle 142 to connect to the support member 120 and move between a first position, P1, and a second position, P2. The resilient member 646 to engage with the handle 142 and move between an equilibrium position, E, and a displaced position, D, based on a position of the handle, 142. The hook member 648 to move between an engaged position, PE, and an unengaged position, PU, based on a position of the resilient member 646. In the engaged position, PE, the hook member extends from the support member 120 to engage with a chassis 860.

The system 800 further includes a tray 980 to attach to the chassis 860, The tray 980 to align the top loading cartridge 100 in the chassis 860. The tray 980 may form slots 982 to receive the top loading cartridge 100. The size of the slots 982 may vary depending on the size of the top loading cartridges 100 intended to be loaded therein. The slots 982 may also include guide rails 984 to guide the top loading cartridge 100 as it is inserted and/or removed from the tray 980. Each guide rail 984 to mate with one of the rail members 230. As illustrated above in FIGS. 2A-2C, for example, the rail member 230 includes a first rail portion 232 and a second rail portion 234. The first rail portion 232 to mate with the support member 120. The second rail portion 234 is spaced apart from the support member 120 to engage with the guide rail 984. The guide rail 984 may be formed of a sheet metal that forms a track or rail that receives the rail member 230. For example, the rail member 230 slides into the guide rail 984 or vice versa. The rail member 230 and the guide rail 984 are formed to reduce vibration and provide a tight fit between the top loading cartridge 100 and the tray 980.

The tray 980 may further include a tray receptacle 986 to receive the engagement member 144, or the hook member 648. The tray receptacle 986 may include a tray protrusion 988 extending therefrom to engage with the engagement member 144 or hook member 648 and to secure the top loading cartridge 100 therein. The tray protrusion 988 may be formed as a lip and/or aperture in the tray 980 or extending from the tray 980.

Figure 9B:
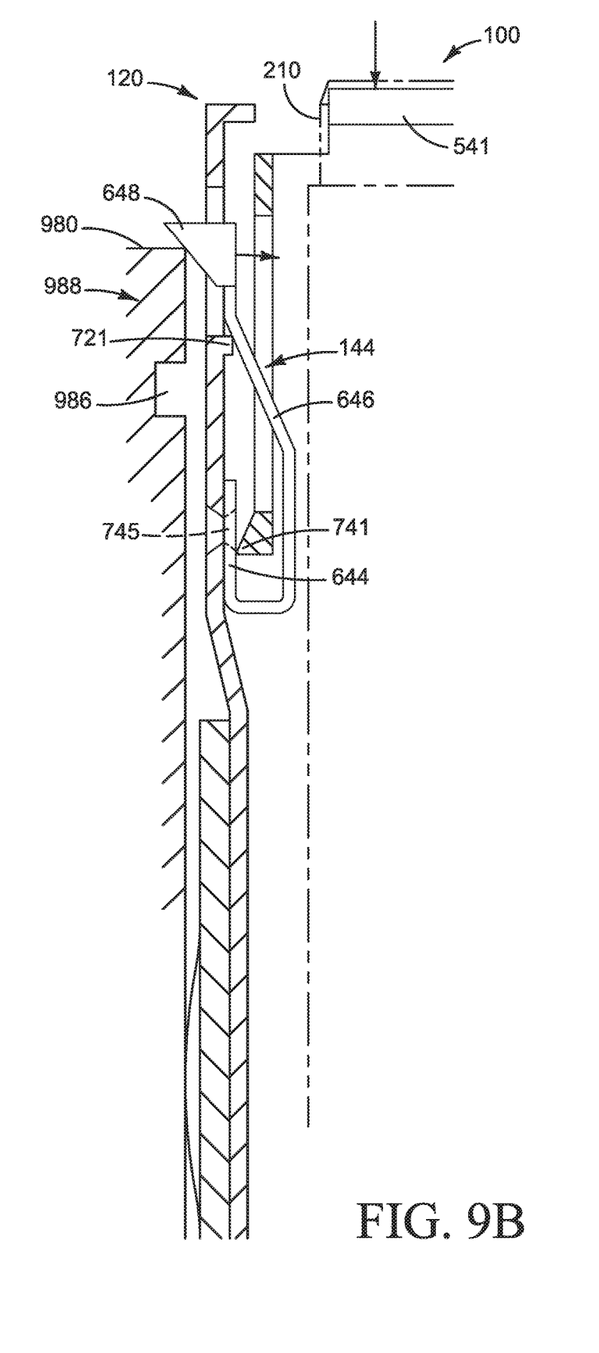

For example, FIG. 9B illustrates a cross-sectional view of a portion of the system 800. The system 800 includes one side of the top loading cartridge 100 and one side of a tray 980. The tray receptacle 986 is illustrated as a groove in the tray 980 and the tray protrusion 988 is illustrated as a lip extending over the tray receptacle 986. The engagement member 144 of the top loading cartridge 100 formed to engage with the tray receptacle 986.

The top loading cartridge 100 is illustrated with the handle 142 in the second position, P2, while the top loading cartridge 100 is being inserted into the tray. The insertion movement enables the tray 980 to apply a force directly to the engagement members 144, such as the hook member 648. The force applied to the engagement members 144 during insertion may push the hook member 648 inward and move the resilient member 646 to a displaced position, D. Once the top loading cartridge 100 is fully inserted, the force applied to the engagement member is released when the hook member 648 slides into the tray receptacle 986. The release of the force applied to the engagement member 144, moves the resilient member 646 to the equilibrium position, E.

When the handle 142 is in the second position P2, the engagement member 144 is in an engaged position, PE. In the engaged position, PE, the resilient member 646 is in an equilibrium position, E, where it is in a resting state. In the equilibrium position, the resilient member 646 allows the hook member 648 to extend from the support member 120 and to engage with a chassis 860, using for example, an engagement aperture 544. The handle 142 also may be in the second position, P2, after the top loading cartridge is inserted into the chassis 860, during operation of the electronic component 210, and/or prior to removal of the loading cartridge from the chassis 860.

The system 800 may further include a system board (not illustrated) coupled to the chassis 860. The system board to connect to the top loading cartridge 100 to enable communication therebetween using, for example, a high speed connector 254, such as a PCIe. The electronic component 210 connects to the system board via the top loading cartridge 100 via a connector 250 that forms a connection between the electronic component 210 and a cartridge printed circuit assembly 252. For example, the electronic component 210 is connected to a backplane, such as a hard disk drive backplane, and an angular connector that connects the backplane to the printed circuit assembly 252 using an angular connector as illustrated in FIG. 3.

Figure 10:
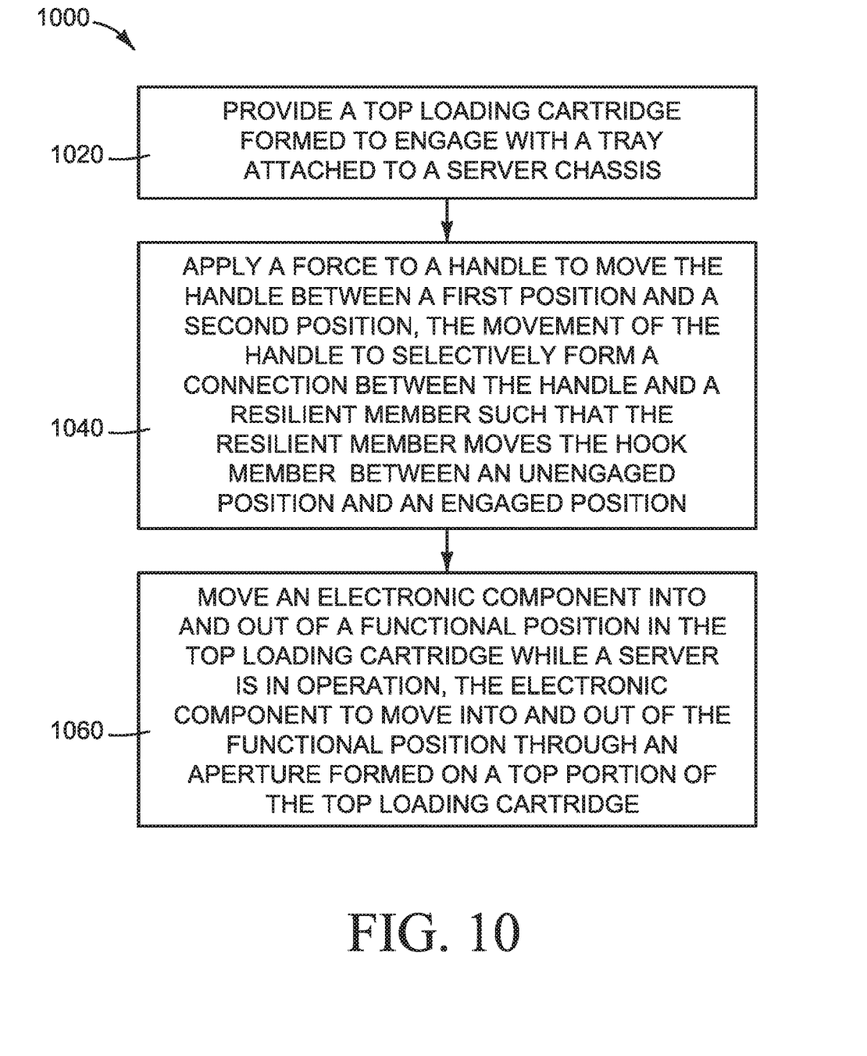
FIG. 10 illustrates a flow chart of a method usable with a top loading cartridge according to an example.

FIG. 10 illustrates a flow chart 1000 of a method usable with a top loading cartridge according to an example. The method provides a top loading cartridge in block 1020. The top loading cartridge formed to engage with a tray attached to a server chassis. The top loading cartridge includes a support member and a lock mechanism. The support member to receive an electronic component. The lock mechanism includes a handle, a resilient member, and a hook member. The handle to connect to the support member and move between a first position and a second position. The resilient member to engage with the handle and move between an equilibrium position and a displaced position based on a position of the handle. The hook member to move between an engaged position and an unengaged position based on the position of the resilient member. In the engaged position, the hook member extends from the support member to engage with a tray.

In block 1040, a force is applied to the handle to move the handle between the first position and the second position. The movement of the handle to selectively form a connection between the handle and the resilient member such that the resilient member moves the hook member between the unengaged position and the engaged position. In the engaged position, the hook member is formed to extend from the support structure and engage with the tray to secure the top loading cartridge in place. In the unengaged position, the hook member is formed to retract.

The electronic component moves into and out of a functional position in the top loading cartridge while a server is in operation in block 1060. The electronic component to move into and out of the functional position through an aperture formed on a top portion of the top loading cartridge. For example, the electronic component slides into the aperture on the top portion of the top loading cartridge and fits in the receiving member. The electronic component may then connect to a circuit board assembly on the top loading cartridge via a connector.

Although the flow diagram of FIG. 10 illustrates specific orders of execution, the order of execution may differ from that which is illustrated. For example, the order of execution of the blocks may be scrambled relative to the order shown. Also, the blocks shown in succession may be executed concurrently or with partial concurrence. All such variations are within the scope of the present disclosure.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A top loading cartridge comprising:
   a support member to receive an electronic component; and
   a lock mechanism including:
      a handle to connect to the support member, the handle to move between a first position and a second position, and
      an engagement member to extend from the support member to engage with a chassis, the engagement member to move between an engaged position and an unengaged position, the engagement member includes
         a hook member on one end,
         a fixed member on an opposite end, and
         a resilient member between the hook member and the fixed member, the resilient member formed to bend between an equilibrium position and a displaced position based on a position of the handle.

2. The top loading cartridge of claim 1, further comprising a receiving member formed in the support member to receive and support the electronic component.

3. The top loading cartridge of claim 1, wherein the handle comprises a planar member adjacent to a top wall of the support member and a pair of side protrusions extending from the planar member, the side protrusions perpendicular to the planar member.

4. A system comprising:
   a top loading cartridge to receive an electronic component that can be inserted and removed while the system operates, the top loading cartridge including:
      a support member to receive the electronic component; and
      a lock mechanism connected to the support member, the lock mechanism including:
         a handle to connect to the support member, the handle to move between a first position and a second position,
         a resilient member to engage with the handle and move between an equilibrium position and a displaced position, and
         a hook member to move between an engaged position and an unengaged position based on a position of the resilient member, in the engaged position, the hook member extends from the support member to engage with a chassis; and
   a chassis to receive the top loading cartridge.

5. The system of claim 4, further comprising a connector to form a connection between the electronic component and a cartridge printed circuit assembly.

6. The system of claim 4, further comprising a rail member, the rail member includes a first rail portion and a second rail portion, the first rail portion and the second rail portion spaced apart from one another, at least one of the first rail portion and the second rail portion to engage with a tray.

7. The system of claim 4, further comprising a tray, the tray includes a guide rail to mate with the rail member, the rail member includes a first rail portion and a second rail portion, at least one of the first rail portion and the second rail portion spaced apart from the support member to engage with the guide rail.

8. The system of claim 4, further comprising a tray to attach to the chassis, the tray to align the top loading cartridge in the chassis.

9. The system of claim 8, wherein the tray further comprises a tray receptacle formed therein, the tray receptacle to receive the engagement member, the tray receptacle including a tray protrusion extending therefrom to engage with the engagement member and to secure the top loading cartridge therein.

10. The system of claim 4 further comprising a system board coupled to the chassis, the system board to connect to the top loading cartridge to enable communication therebetween.

11. The system of claim 4, wherein the support member comprises:

two side walls spaced apart from one another;
a top wall to traverse the two side walls; and
a support wall to extend between the two side walls,
the top wall, the two side walls, and the support wall to form a top aperture to enable insertion and removal of the electronic component without removing the top loading cartridge.

12. The system of claim 11, further comprising a receiving member formed in the support member to receive the electronic component.

13. A method usable with a top loading cartridge, the method comprising:
providing a top loading cartridge formed to engage with a tray attached to a server chassis, the top loading cartridge including:
a support member to receive an electronic component; and
a lock mechanism including:
a handle to connect to the support member, the handle to move between a first position and a second position,
a resilient member to engage with the handle and move between an equilibrium position and a displaced position based on a position of the handle, and
a hook member to move between an engaged position and an unengaged position based on a position of the resilient member, in the engaged position, the hook member extends from the support member to engage with the tray;
applying a force to the handle to move the handle between the first position and the second position, the movement of the handle to selectively form a connection between the handle and the resilient member such that the resilient member moves the hook member between the unengaged position and the engaged position,
in the engaged position, the hook member formed to extend from the support structure and engage with the tray and secure the top loading cartridge in place,
in the unengaged position, the hook member formed to retract; and moving the electronic component into and out of a functional position in the top loading cartridge while a server is in operation, the electronic component to move into and out of the functional position through an aperture formed on a top portion of the top loading cartridge.

14. The method of claim 13, further comprising forming a connection between the electronic component and a cartridge printed circuit assembly.

15. The method of claim 13, further comprising engaging a rail member on the top loading cartridge with the tray.

16. The method of claim 15, further comprising mating a guide rail on the tray with the rail member.

17. The method of claim 13, further comprising aligning the top loading cartridge in the chassis using the tray attached to the chassis.

18. The method of claim 13, further comprising forming a connection for communication between a system board and the top loading cartridge.

19. The method of claim 13, further comprising engaging an engagement member with a tray receptacle and securing the top loading cartridge therein.

20. The method of claim 13, further comprising insertion and removal of the electronic component through a top aperture without removing the top loading cartridge.

* * * * *